United States Patent [19]

Fukui et al.

[11] Patent Number: 5,612,090
[45] Date of Patent: Mar. 18, 1997

[54] IRON-BASED MATERIAL HAVING EXCELLENT OXIDATION RESISTANCE AT ELEVATED TEMPERATURES AND PROCESS FOR THE PRODUCTION THEREOF

[75] Inventors: Yasushi Fukui, Osaka; Atsushi Ando, Sakai; Yoshikazu Morita; Masanori Matsuno, both of Izumisano; Minoru Saito, Izumiotsu; Hideo Miyake, Sakai; Masahiko Souda, Amagasaki, all of Japan

[73] Assignee: Nisshin Steel Co., Ltd., Tokyo, Japan

[21] Appl. No.: 467,637

[22] Filed: Jun. 6, 1995

Related U.S. Application Data

[62] Division of Ser. No. 155,373, Nov. 22, 1993.

[30] Foreign Application Priority Data

Nov. 20, 1992 [JP] Japan ................................ 4-333869
Jun. 17, 1993 [JP] Japan ................................ 5-169870

[51] Int. Cl.⁶ ............................................. C23C 14/08
[52] U.S. Cl. ................. 427/255.3; 427/295; 427/377; 427/566; 427/585; 427/596; 427/597; 502/439
[58] Field of Search ............................. 427/248.1, 255.3, 427/126.4, 295, 377, 566, 585, 596, 597; 502/439

[56] References Cited

U.S. PATENT DOCUMENTS 3,837,894  9/1974  Tucker, Jr. ............................. 117/70 A
3,864,093  2/1975  Wolfla ....................................... 29/195
4,414,249  11/1983  Ulion et al. ........................... 427/248.1
4,490,191  12/1984  Hale ....................................... 148/31.5
4,533,605  8/1985  Hoffman .................................. 428/635
4,847,163  7/1989  Shimamune et al. .................... 428/469
5,055,319  10/1991  Bunshah et al. .......................... 427/38

FOREIGN PATENT DOCUMENTS 3-72069  3/1991  Japan .
4-124263  4/1992  Japan .

Primary Examiner—Shrive Beck
Assistant Examiner—Timothy H. Meeks
Attorney, Agent, or Firm—Lowe, Price, LeBlanc & Becker

[57] ABSTRACT

An iron-based heat-generating material excellent in oxidation resistance at an elevated temperature which comprises an iron-based alloy capable of generating heat by passing electricity therethrough and a coating of aluminum and oxygen formed on the surface of the alloy, the amount of the oxygen in the coating is less than the stoichiometric amount of oxygen in $Al_2O_3$. The material can be prepared by vacuum evaporation of Al onto the surface of the iron-based alloy wherein an oxygen partial pressure in a vacuum gaseous atmosphere for the vacuum evaporation is adjusted so that there is formed on the surface of the alloy a coating consisting of aluminum and oxygen, the amount of the oxygen in the coating being less than the stoichiometric amount of oxygen in $Al_2O_3$. When the material is heated in ambient or oxidizing atmosphere, an outermost layer of the coating is rapidly converted to $Al_2O_3$.

9 Claims, 2 Drawing Sheets

FIG. 1
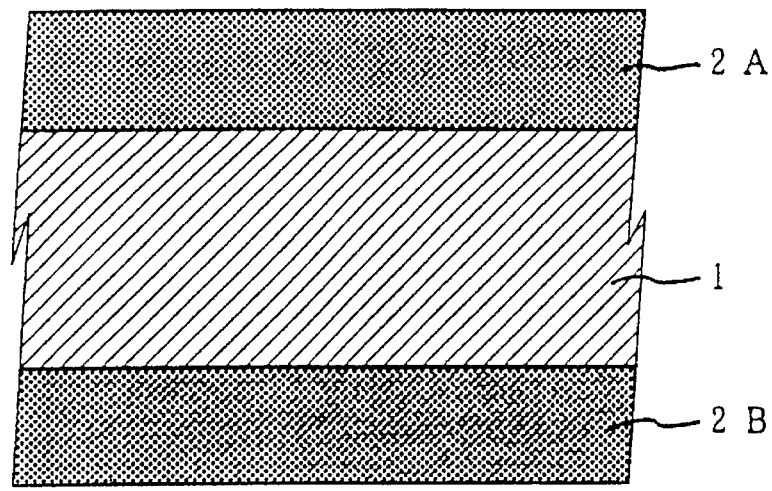
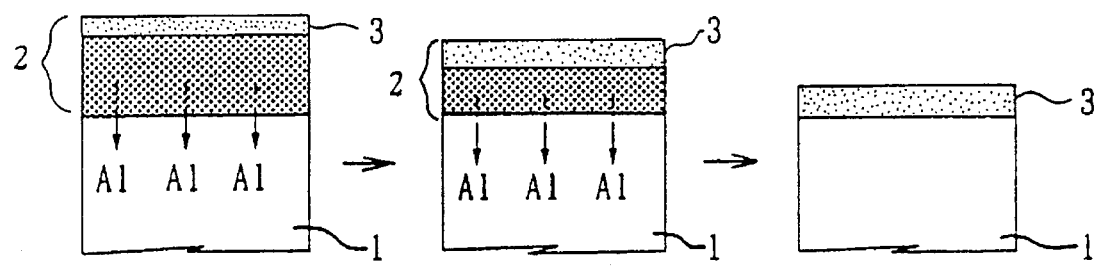
FIG. 2 (a)   FIG. 2 (b)   FIG. 2 (c)

5,612,090

IRON-BASED MATERIAL HAVING EXCELLENT OXIDATION RESISTANCE AT ELEVATED TEMPERATURES AND PROCESS FOR THE PRODUCTION THEREOF

This application is a division of application Ser. No. 08/155,373 filed Nov. 22, 1993.

FIELD OF THE INVENTION

The invention relates to an iron-based material which has an insulating coating and is excellent in oxidation resistance at elevated temperatures. It also relates to a process for the production of such a material. The material according to the invention is useful in applications where excellent oxidation resistance at elevated temperatures is requested, for example as an electrically heat-generating material in a heater and as a catalyst supporting foil in a metallic frame converter for treating an automobile exhaust gas.

PRIOR ART

Electrically heat-generating materials for use in heaters require heat resistance. Accordingly, as such materials there have been widely used alloys, including, for example, alloys of Ni-Cr series and alloys of Fe-Cr-Al series, which are capable of generating heat by passing electricity therethrough and are excellent in heat resistance.

When such an electrically heat-generating material is mounted in a heater, it is frequently required to insulate the material from a member for supporting the material and from an atmosphere surrounding the material. For this purpose insulating materials such as ceramics are generally used. When the heat-generating material is in the form of a plate or sheet, one or both sides of the plate or sheet must be insulated. For this purpose, heat resistant insulating sheets made of glass or ceramic fibers may be used. When the heat-generating material is in the form of a wire, the wire may be fitted in a tube-shaped insulating material. Especially, in the case of a heat-generating material for use at elevated temperatures, ceramic insulators are generally used irrespective of whether the heat-generating material is in the form of a plate (sheet) or wire.

On the other hand, an insulating coating may be directly formed on the surface of a heat-generating metallic material. For example, when a high chromium steel (stainless steel) is used as the heat-generating material, an insulating layer of $Al_2O_3$ may be formed on the surface of the steel.

As a catalyst supporting material in a metallic frame converter for treating an automobile exhaust gas, use is generally made of a foil excellent in oxidation resistance at an elevated temperature.

Problems the Invention Aims to Solve

To surround a heat-generating metallic material with a ceramic insulating material increases a volume of the product. For this reason, use of ceramic insulators may be limited. Furthermore, since ceramic materials are inherently hard to work, they are not frequently applicable for surrounding complicatedly shaped or large sized heat-generating materials.

In addition there is a problem in that surrounding of a heat-generating metallic material with an insulating material impairs heat conductivity of the product. Particularly, when there is an air layer between the heat-generating and insulating materials, the air layer acts as an adiabatic layer.

Furthermore, there is no denying of that the insulating material surrounding the heat-generating material reflects some of heat radiated from the heat-generating material thereby reducing an amount of the heat radiation arriving at an object to be heated.

To solve these problems it may be sufficient to directly bond an insulating material on the surface of the heat-generating metallic material with no air intervened between the materials. However, an insulating material normally has an thermal expansion coefficient and ductility much smaller than a metallic material. Accordingly, if a heat-generating material comprising a heat-generating metallic material having an insulating material directly adhered thereto is repeatedly subjected to a cycle of heating and cooling, the insulating material may frequently peel off or generate cracking. Particularly, since an insulating ceramic material is easily affected by heat-shock, it may generate cracking when used at elevated temperatures.

An heat-generating material comprising a heat-generating metallic material having an insulating coating of $Al_2O_3$ directly formed thereon also poses the similar problem due to differences of thermal expansion and ductility between both the materials as discussed in the preceding paragraph.

Known in the art is a process for producing a heat resisting steel alloy product which comprises heating a steel alloy containing an appropriate amount of Al or having an Al coating on the surface thereof in an ambient or oxidizing atmosphere to form a layer of $Al_2O_3$ on the surface of the alloy. The product is useful in applications where heat resistance is desired, since the $Al_2O_3$ surface layer acts to suppress oxidation of the steel alloy.

However, if this known process is applied to a heat generating steel alloy, a heating at an extremely high temperature and/or a heating for a prolonged period of time is required in order to form a dense $Al_2O_3$ surface layer having a satisfactory insulating property. For example, in order to form a dense $Al_2O_3$ surface layer having a thickness of 0.5 μm on a steel alloy containing 5% of Al, a heating of the steel alloy at a temperature of 1100° C. for 5 hours is required. Accordingly, an attempt to form a dense $Al_2O_3$ layer having a satisfactory insulating property on the surface of a heat-generating steel alloy is impractical because of poor productivity. Furthermore, a prolonged heating at an elevated temperature may invite abnormal oxidation, leading to volume expansion and in turn cracking of the resulting coating.

In many case a heat-generating iron-based steel alloy sheet used in a heater is frequently as thin as a foil whose volume is extremely thin in comparison with its surface area. Accordingly, even if Al is contained in the iron-based steel alloy sheet, the Al will be greatly consumed during the oxidative heating treatment step for the formation of $Al_2O_3$. The reduction in the amount of Al in the iron-steel alloy sheet may invite not only a lacking of Al in the steel sheet necessary for the reproduction of $Al_2O_3$ during the service of the heat-generating sheet, but also a change in the electric resistance of the sheet not to ensure an expected amount of heat generation. Furthermore, if the $Al_2O_3$ layer peels off for some reasons during the use of the heat-generating sheet at an elevated temperature, the consumption of Al will increase to further shorten a service life of the heat-generating sheet.

An object of the invention is to provide an iron-based material comprising an iron-based steel having thereon a dense insulating or protecting layer having a prolonged service life thereby to overcome the above-discussed problems associated with the prior art.

DISCLOSURE OF THE INVENTION

The invention provides an iron-based material excellent in oxidation resistance at elevated temperatures which comprises an iron-based alloy and a coating consisting essentially of aluminum and oxygen formed on the surface of said alloy, the amount of the oxygen in said coating is less than the stoichiometric amount of oxygen in $Al_2O_3$.

The material according to the invention can be prepared by a process which comprises vacuum evaporation coating of Al onto the surface of an iron-based alloy wherein an oxygen partial pressure in a vacuum gaseous atmosphere for the vacuum evaporation is adjusted so that there is formed on the surface of the iron-based alloy a coating consisting essentially of aluminum and oxygen, the amount of the oxygen in said coating being less than the stoichiometric amount of oxygen in $Al_2O_3$.

A preferred material according to the invention comprises an iron-based alloy containing 8–35 mass % of Cr and 0.4–8 mass % of Al and an Al-O coating consisting essentially of 50–99 mol % of aluminum and 1–50 mol % of oxygen formed on the surface of said alloy.

When the material according to the invention is heated in an ambient or oxidizing atmosphere, an outermost layer of the Al-O coating is converted to $Al_2O_3$. This heating may be effected after the material according to the invention is fabricated and mounted in position, for final use.

Thus, the invention further provides an iron-based material obtained by heating in an oxygen-containing atmosphere a material which comprises an iron-based alloy containing 8–35 mass % of Cr and 0.4–8 mass % of Al and an Al-O coating on the surface of said alloy consisting essentially of 50–99 mol % of aluminum and 1–50 mol % of oxygen, thereby converting the outermost layer of the Al-O coating to $Al_2O_3$.

Generally, when Al reacts with O, $Al_2O_3$ is formed. Accordingly, "a coating consisting essentially of aluminum and oxygen, the amount of the oxygen in the coating is less than the stoichiometric amount of oxygen in $Al_2O_3$" referred to herein may be said a coating of metallic Al having minute particles of $Al_2O_3$ admixed therewith. When such a coating is heated in ambient atmosphere at an elevated temperature (for example, a temperature between 1000° and 1200° C.), while Al existing on the outermost layer of the coating is rapidly oxidized to form a dense layer of $Al_2O_3$ which acts as a barrier for preventing oxidation of Al existing inside the coating, which Al, instead of being oxidized, diffuses into the iron-based alloy, thereby the $Al_2O_3$ is concentrated in the coating.

The oxidation resistance of the iron-based alloy at an elevated temperature is improved by the diffusion of Al into the alloy. With an Al-O coating having an oxygen concentration of less than 1 mol %, the outermost layer of the coating will not be rapidly converted to a dense layer of $Al_2O_3$ when the coating is heated in ambient atmosphere at an elevated temperature. On the other hand with an Al-O coating having an oxygen concentration of more than 50 mol % the diffusion of Al into the iron-based alloy will be impaired. Accordingly the oxygen concentration of the Al-O coating should preferably be 1 to 50 mol %.

BRIEF DESCRIPTION OF THE DRAWINGS

FIG. 1 is a cross-sectional diagram of a material according to the invention obtained by forming on each surface of an iron-based alloy sheet 1 an Al-O coating 2A, 2B, each coating having an oxygen concentration less than that of $Al_2O_3$;

FIG. 2 diagrammatically shows changes of the coating when the material of FIG. 1 is heated in ambient atmosphere.

DETAILED DESCRIPTION OF THE INVENTION

Figure 3:
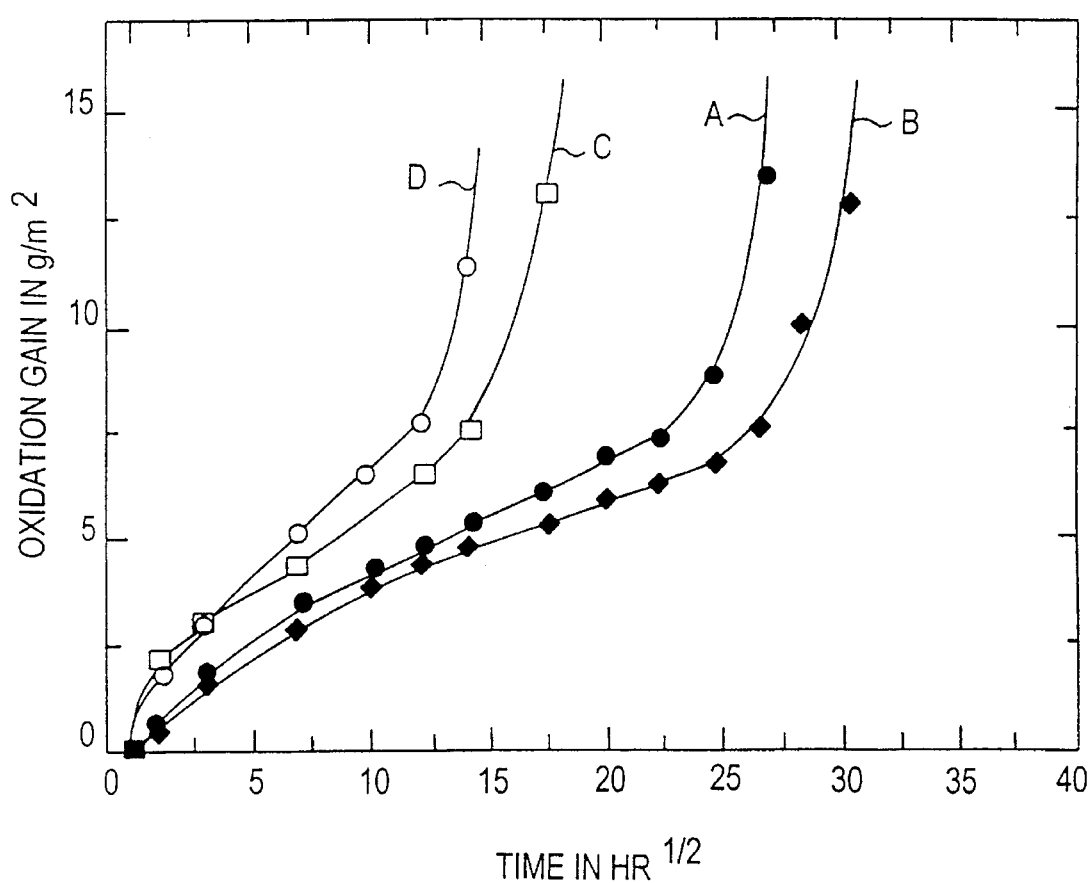
FIG. 3 graphically shows change of oxidation gain with time on four materials listed in Table 3.

The material according to the invention shown in FIG. 1 comprising an iron-based alloy sheet 1 and Al-O coatings 2A and 2B formed on both the surfaces of the sheet 1, the oxygen concentration in each coating 2A, 2B is less than that in $Al_2O_3$, is obtained by vacuum evaporation coating of Al onto the surfaces of the iron-based alloy sheet 1 wherein an oxygen partial pressure in a vacuum gaseous atmosphere for the vacuum evaporation is appropriately adjusted in a manner as hereinafter illustrated.

When the material shown in FIG. 1 is heated in ambient atmosphere at a temperature of 1100° C. as illustrated hereinafter, a dense layer of $Al_2O_3$ is formed via stages (a), (b) and (c) as diagrammatically shown in FIG. 2. While FIG. 2 shows changes on one side of the material, similar changes happen on the other side of the material. In the first stage (a), the outermost surface of the Al-O coating 2 is rapidly converted to a thin dense $Al_2O_3$ layer 3 and uncombined Al existing inside the Al-O coating 2 begins to diffuse into the iron-based alloy sheet 1. In the next stage (b), the uncombined Al remaining inside the Al-O coating 2 continues to diffuse into the iron-based alloy sheet 1 while being prevented from being oxidized by the presence of the thin dense $Al_2O_3$ layer 3 formed in the stage (a), which acts as a barrier, thereby the thickness of the Al-O coating 2 is reduced and $Al_2O_3$ is concentrated in the coating 2. Finally, the uncombined Al in the Al-O coating 2 has been completely exhausted, leaving a material as shown in FIG. 2 (c) which consists of a dense $Al_2O_3$ layer 3 and an Al-enriched iron-based alloy sheet 1. Thus, the invention further provides an iron-based material excellent in oxidation resistance at an elevated temperature comprising an iron-based alloy and a coating consisting essentially of $Al_2O_3$ firmly adhered to the surface of said alloy, said material being obtained by heating a material comprising an iron-based alloy and a coating consisting essentially of aluminum and oxygen formed on the surface of said alloy, the amount of the oxygen in said coating is less than the stoichiometric amount of oxygen in $Al_2O_3$ in an oxygen-containing atmosphere until uncombined Al in the Al-O coating is completely exhausted. The heating temperature should be sufficient for diffusion of Al from the coating into the alloy, and is conveniently within the range between about 650° C. and about 1250° C. In a case wherein the starting iron-based alloy sheet 1 shown in FIG. 1 is very thin (e.g. 0.1 mm or less) and contains Al in a high amount (e.g. near 8 mass %), at the time the stage (c) has been just reached, the Al enriched iron-based alloy substrate 1 shown in FIG. 2 (c) may frequently have an average Al concentration of about 10 to about 15 mass %.

When an Al coated iron-based alloy sheet is heated in an oxygen-containing atmosphere at an elevated temperature, a part of the Al in the coating is oxidized while the remaining part of the Al in the coating diffuses into the alloy sheet, whereby a layer of $Al_2O_3$ is formed on the surface of the alloy sheet. However, since no oxygen is present in the Al coating, the Al$_2$O$_3$ layer formed is not so dense and not so firmly adhered to the alloy sheet as the Al$_2$O$_3$ layer 3 formed in the material according to the invention. The discussed differences between the material according to the invention and the comparable Al coated material will be substantiated by examination of the oxidation gain of the materials. As illustrated hereinafter, the material according to the invention exhibits a reduced oxidation gain when compared the comparable Al coated material. A reduced oxidation gain means an improved and durable oxidation resistance at an elevated temperatures and a durable insulating property.

While the material according to the invention may be used in the intended application in a condition as shown in FIG. 1, that is, in the form of the iron-based alloy as coated with an Al-O coating whose oxygen concentration is less than that in Al$_2$O$_3$, it is preferably used in conditions that a dense Al$_2$O$_3$ layer 3 is formed at least on the outermost surface of the material. When the material in a conditions as shown in FIG. 1 or FIG. 2 (a) or (b) is used at an elevated temperature, it will become a condition shown in FIG. 2 (c) during the use. To ensure an improved and durable oxidation resistance at an elevated temperatures and a durable insulating property, the material according to the invention is preferably preheated to a condition shown in FIG. 2 (c) to form a dense Al$_2$O$_3$ layer 3 firmly adhered to the iron-based alloy 1.

Since the coatings 2A and 2B in the condition shown in FIG. 1 are easily workable, it is practical that the material according to the invention in the condition shown in FIG. 1 is fabricated to a desired member, mounted in position and thereafter subjected to the oxidative heating to form an Al$_2$O$_3$ layer on the outermost surface as shown in FIG. 2 (b) or (c).

The material according to the invention in the condition shown in FIG. 1 is prepared by vacuum evaporation coating of Al onto the surface of an iron-based alloy wherein an oxygen partial pressure in a vacuum gaseous atmosphere for the vacuum evaporation is adjusted so that there is formed on the surface of the iron-based alloy a coating consisting essentially of aluminum and oxygen, the amount of the oxygen in said coating being less than the stoichiometric amount of oxygen in Al$_2$O$_3$.

Among vacuum evaporation methods, PVD and CVD methods are suitable, with preference to PVD methods capable of more rapid coating. Among PVD methods, particularly preferred are ionization vacuum evaporation methods, in which an arc discharge is generated between metal in a crucible and an electrode above the crucible; at least a part of evaporated metal is ionized in the arc; and the ionized metal vapor is deposited onto a substrate in an oxygen-containing vacuum atmosphere, as described in JP A-1, 3-72069 and JP A-1, 4-124263. Since the ionized metal is highly reactive with oxygen, the metal can be rapidly deposited onto the substrate together with the oxygen.

In any event it is essential to adjust a partial pressure of the oxygen-containing vacuum atmosphere so that there is deposited on the surface of the iron-based alloy a coating consisting essentially of aluminum and oxygen, the amount of the oxygen in the coating being less than the stoichiometric amount of oxygen in Al$_2$O$_3$. The adjustment of the oxygen partial pressure of the vacuum atmosphere includes adjusting partial pressures of oxygen gas and other oxygen-containing gases such as H$_2$O, CO$_2$ and CH$_3$OH contained in the vacuum atmosphere. If it is desired to maintain the pressure of the vacuum atmosphere at a certain value, an inert gas such as Ar may be allowed to exist in the vacuum atmosphere.

The iron-based alloy should be capable of generating heat, if the product is intended to be used as a heat-generating member of a heater. Since the material according to the invention is intended to be used at elevated temperatures, the iron-based alloy should desirably be stainless steel containing 8–35 mol % of Cr and 0.4–8 mol % of Al. The durability of the oxidation resistance of such an Al containing stainless steel can be enhanced by addition of 0.6–6 mol % of Si and/or up to 0.2 mol % of one or more of rare earth metals and Y. The functions of Cr, Al, Si, rare earth metals and Y in the iron-based alloy will now be described.

Re: Cr

When the material according to the invention is subjected to cycles of heating and cooling, the material may crack and be self-remedied at the expense of Al contained in the iron-based alloy. In a case wherein the iron-based alloy is in the form of a thin foil, Al in the foil is frequently exhausted as a result of repeated such self-remedy. If Al in the foil has been exhausted, electrically conductive Fe oxides are formed and rapidly grow in the foil, causing the Al$_2$O$_3$ coating to peel off. We have found that the growing of such Fe oxides can be suppressed by the presence of at least 8 mol % of Cr in the alloy foil. This is believed that when Al has been exhausted in the foil, Cr$_2$O$_3$ and FeO.Cr$_2$O$_3$ are densely formed in the foil, and suppress the subsequent formation of the Fe oxides. Furthermore, the presence of Cr enhances the toughness and workability of the foil. However, addition of substantially in excess of 35 mol % of Cr renders the foil unduly brittle to be mechanically worked.

Re:Al

When the Al$_2$O$_3$ coating is impaired, cracks or peels off for some reasons, Al contained in the iron-based alloy serves to remedy the faults during the use of the material at an elevated temperature. For this reason the iron-based alloy should contain at least 0.4 mass % of Al, although a certain amount of Al is supplied by its diffusion from the Al-O coating. However, since an excessively high amount of Al renders the iron-based alloy brittle, addition of exceeding 8 mass % of Al must be avoided.

Re: Rare earth metals and Y

As demonstrated hereinafter, rare earth metals (REM) and Y serve to enhance the life of the high temperature oxidation resistance of the material and to improve the adhesion of the Al$_2$O$_3$ layer to the substrate alloy. Particularly, in a case wherein the Cr content of the substrate steel alloy is less than 8 mass %, the high temperature life of the material can be efectively improved by addition of at least 0.005 mass % of REM and Y in total. This effect of REM and Y is particularly prominent in a case wherein the substrate steel alloy is in the form a thin foil having a thickness of 0.1 mm or less. However, REM and Y in excess of 0.2 mass % in total tends to become inclusions which precipitate in the alloy and adversely affect the adhesion of the Al$_2$O$_3$ layer to the alloy. Accordingly, REM and Y, if any, should be added up to 0.2 mass % in total.

Re :Si

As demonstrated hereinafter, Si also serves to enhance the life of high temperature oxidation resistance of the material. This is because when Al has been completely exhausted in the substrate steel alloy, there are densely formed SiO$_2$ and Fe$_2$SiO$_2$, which suppress the subsequent oxidation of the alloy. However, as the Si content approaches and exceeds 6 mass %, the above-mentioned effect of Si is saturated, instead, the production easiness and workability of the alloy tend to be adversely affected. For this reason, the Si content must be 6 mass % or less.

Generally, the iron-based alloy contemplated herein comprises, by mass %, C up to 0.2, Si up to 6, Mn up to 5, Al 0.4 to 8, Cr up to 35, N up to 0.3, and optionally Mo up to 3, Cu up to 3, one or more of Ti, Nb, Zr and V up to 1.5 in total, one or more of rare earth metals (REM) and Y up to 0.2 in total, the balance Fe and impurities.

EXAMPLE 1

Using a vacuum evaporation apparatus equipped with an electron beam evaporator, square sheets made of Steel No. 1 or 2 as indicated in Table 1 and each having a thickness of 1 mm and a surface area of 200 mm square were vacuum evaporation coated with Al on both sides. Pure Al was used as a target in the electron beam evaporator. In each run, the vacuum evaporation apparatus was evacuated to $1\times10^{-5}$ Torr and a mixed gas of $O_2$: Ar=1:1 was introduce into the apparatus until a preset oxygen partial pressure was reached, and thereafter Al was evaporated by means of electron beam. The rate of deposition on the sheet was adjusted to 0.1 μm coating/sec. The partial pressure of the mixed gas of $O_2$ and Ar was adjusted so that each oxygen concentration indicated in Table 2 was obtained. The vacuum evaporation was finished at the time 5.5 g equivalent/m² of Al had been deposited on each side of the sheets Ar was used for a purpose of preventing deterioration of a pump oil used.

The oxygen concentration (in mol %) of each coating obtained is listed in Table 2. Since the stoichiometric concentration of oxygen in $Al_2O_3$ is 3/5×100 mol %=60 mol %, it will be understood that the Al-O coatings obtained have the oxygen concentration considerably lower than that of $Al_2O_3$. The Al-O coating obtained can be said as comprising Al having $Al_2O_3$ mixed therewith or as $Al_2O_3$ having uncombined metallic Al mixed therewith. Incidentally, the coating indicated in Table 2 as having 0% of oxygen is a pure Al coating which was obtained using an infinitesimal oxygen partial pressure.

Each vacuum evaporation coated sheet was heated in ambient atmosphere at a temperature of 1100° C. until its electric resistance became at least $1\times10^8$ Ωm. The time required, in hour is shown in Table 2. The electric resistance was measured by applying a DC voltage to copper poles each connected to each side of the heated product.

TABLE 1

| Steel No. | Al | Cr | Si | Mn | C | Ti | La | REM other than La |
|---|---|---|---|---|---|---|---|---|
| 1 | 5.01 | 20.5 | 0.30 | 0.25 | 0.01 | 0.08 | 0.13 | 0.05 |
| 2 | 3.03 | 17.9 | 0.31 | 0.27 | 0.01 | 0.08 | 0.11 | 0.06 | in mass %

TABLE 2

| Steel No. | Oxygen conc. in coating in mol % | Time taken for insulation in hr. |
|---|---|---|
| a | | |
| 1 | 1.3 | 4.0 |
| | 20.5 | 2.0 |
| | 31.0 | 1.5 |
| | 45.9 | 1.0 |
| 2 | 20.5 | 2.5 |
| | 31.0 | 1.5 |
| | 45.9 | 1.0 |
| b | | |
| 1 | 0 | 5.0 |
| | no coating | 5.0 |
| 2 | 0 | 5.0 |
| | no coating | 9.0 | a: Products according to the invention
b: Control products
insulation: Electric resistance of $1\times10^2$ Ωm or more It will be understood from the results shown in Table 2 that when the product according to the invention is heated in ambient atmosphere, the higher the oxygen concentration in the coating formed by vacuum evaporation, the faster the product can be insulated. In other words, the product according to the invention, when heated in air, rapidly forms a dense insulating $Al_2O_3$ layer 3 via stages (a), (b) and (c) shown in FIG. 2. In contrast, it takes a considerable time to form a similar insulating $Al_2O_3$ layer by oxidizing a pure Al coating or Al in the steel as revealed from control examples of Table 2.

EXAMPLE 2

Products A and B according to the invention and Control Product C shown in Table 3 were prepared in the manner described in Example 1 except that foils made of Steel No. 2 shown in Table 1 and having a thickness of 0.05 mm were used as substrates and 4 g equivalent/m² of Al deposited on each side of each foil. Control Product C had pure Al coatings. Control Product D was a foil made of Steel No. 1 shown in Table 1 and having a thickness of 0.05 mm.

TABLE 3

| | Steel No. | Oxygen Conc. in coating |
|---|---|---|
| a | | |
| A | 2 | 20.5 mol % |
| B | 2 | 45.9 mol % |
| b | | |
| C | 2 | 0 mol % |
| D | 1 | no coating | a: Products according to the invention
b: Control products

Here, Products A, B and C are foils of Steel No. 2 containing 3.03% having 4 g/m² of Al vacuum evaporation deposited on each side thereof, while Product D is a foil of Steel No. 1 containing 5.01% of Al. Accordingly, all Products have the same total Al content.

All products were subjected to a test for heat resistance. The test was carried out by continuously heating each product in ambient atmosphere at a temperature of 1100° C. and measuring a change in oxidation gain with time. Results are graphically shown in FIG. 3, in which the unit of the abscissa is a square root of the time in hour. Accordingly, the actual heating time is a square power of the time value expressed in FIG. 3.

From the results shown in FIG. 3 it is revealed that Products A and B according to the invention do not undergo abnormal oxidation before $22^2$–$25^2$ hours (480–630 hr) as reflected by their slow increase in the oxidation gain, whereas Control products C and D begin to undergo abnormal oxidation after $12^2$–$14^2$ hours (140–190 hr) due to complete exhaustion of Al in the substrate steels.

Control products which had undergone abnormal oxidation had a surface electric resistance of less than $1\times10^8$ Ωm. It is believed that this was because the coating had cracked and peeled off as a result of volume expansion at the time of abnormal oxidation.

EXAMPLE 3

Products according to the invention were prepared in the manner described in Example 1 except that foils made of Steels No. 3 to 8 shown in Table 4 and having a thickness of 0.05 mm were used as substrates and Al-O coatings having an average oxygen concentration of 20 mol % were formed on both sides of each substrate. For comparison purposes control products having pure Al coatings were similarly prepared from foils made of Steels No. 3, 4 and 7 shown in Table 4 and having a thickness of 0.05 mm. Each product had 5.5 g equivalent/m² of Al deposited on each side of each substrate.

Each product was continuously heated at a temperature of 1150° C. and the oxidation resistance life at that temperature, that is a time at which oxidation begins to rapidly proceed, namely a time at which the oxidation gain begins to rapidly increase, was determined. Results are also shown in Table 4. After the elapse of the oxidation resistance life, the electric resistance of the product became less than $1 \times 10^8$ Ωm.

and cooling test under ambient atmosphere. The test comprised 100 cycles of heating from 100° C. to 900° C. at a rate of 2° C./sec., maintaining at 900° C. for 600 sec. and allowing to cool from 900° C. to 100° C. At the end of the 100 cycles the electric insulation resistance was determined by applying a DC voltage to copper poles each connected to each side of the test piece. Results are shown in Table 5. Incidentally, before the test each test piece had an insulation resistance of well above $1 \times 10^{10}$ Ωm.

TABLE 4

| Steel No. | Al | Cr | REM | Y | C | Si | Mn | Ti | Life of high temp. oxidation resistance in hr. |
|---|---|---|---|---|---|---|---|---|---|
| a | | | | | | | | | |
| 3 | 1.1 | 16.1 | 0.11 | — | 0.02 | 0.23 | 0.31 | 0.06 | 70 |
| 4 | 3.0 | 8.2 | 0.02 | 0.11 | 0.03 | 0.34 | 0.32 | 0.08 | 260 |
| 5 | 3.0 | 8.3 | 0.13 | — | 0.02 | 2.60 | 0.28 | 0.07 | 320 |
| 6 | 4.9 | 11.6 | — | — | 0.03 | 0.26 | 0.29 | 0.07 | 110 |
| 7 | 5.1 | 12.0 | 0.12 | — | 0.03 | 0.26 | 0.29 | 0.07 | 650 |
| 8 | 5.0 | 11.9 | 0.11 | — | 0.03 | 1.80 | 0.29 | 0.06 | 730 |
| 9 | 5.1 | 12.0 | 0.12 | — | 0.02 | 0.7 | 0.26 | 0.05 | 700 |
| 10 | 5.0 | 11.8 | 0.13 | — | 0.02 | 3.0 | 0.27 | 0.06 | 750 |
| 11 | 5.0 | 12.2 | 0.11 | — | 0.02 | 5.8 | 0.30 | 0.06 | 810 |
| b | | | | | | | | | |
| 3 | 1.0 | 16.0 | 0.11 | — | 0.02 | 0.23 | 0.31 | 0.06 | 40 |
| 4 | 3.0 | 8.2 | 0.02 | 0.11 | 0.03 | 0.34 | 0.32 | 0.08 | 110 |
| 7 | 5.1 | 12.0 | 0.12 | — | 0.03 | 0.31 | 0.30 | 0.07 | 320 | in mass %
a: Products according to the invention having Al oxide-containing Al coatings
b: Control products having pure Al coatings From the results shown in Table 4 the followings are revealed.

1) With the same substrate steel the product according to the invention having Al₂O₃-containing Al coatings has a longer life of high temperature oxidation resistance than the comparable control product having pure Al coatings.

2) Among the products according to the invention having Al₂O₃-containing Al coatings, the higher the Al content in the substrate steel the longer the life of high temperature oxidation resistance.

3) Among the products according to the invention, the higher the Si content in the substrate steel the longer the life of high temperature oxidation resistance. Compare products made from Steels No. 4 and 5.

4) As to the products according to the invention, addition of REM to the substrate steel enhances the life of high temperature oxidation resistance. Compare products made from Steels No. 6 and 7.

EXAMPLE 4

Onto both sides of a rectangular substrate steel plate having a thickness of 2.5 mm and a size of 30 mm×80 mm and made of each of steels having compositions with various Al concentrations shown in Table 5, Al-O coatings having a thickness of 0.5 μm and an oxygen concentration of 50 mol % was vacuum evaporation coated by an ionization vacuum evaporation method described in JP A-1, 3-72069 and JP A-1, 4-124263. The coated plate was subjected to a heating

TABLE 5

| | Effect of Al in steel | | | | |
|---|---|---|---|---|---|
| | Steel component (wt %)* | | | | Insulation |
| | Al | C | Si | Mn | resistance** |
| a | 0.5 | 0.021 | 0.20 | 0.37 | ○ |
| | 1.1 | 0.030 | 0.16 | 0.33 | ○ |
| | 3.0 | 0.025 | 0.24 | 0.22 | ○ |
| | 5.0 | 0.022 | 0.25 | 0.23 | ○ |
| b | 0.03 | 0.027 | 0.10 | 0.19 | XX |
| | 0.1 | 0.031 | 0.22 | 0.25 | XX |
| | 0.3 | 0.29 | 0.21 | 0.32 | X |

*Balance Fe and impurities
**○; $1 \times 10^{10}$ Ωm or more
X; not less than $1 \times 10^1$ Ωm and less than $1 \times 10^1$ Ωm
XX; less than $1 \times 10^1$ Ωm
a: Products according to the invention
b: Control products As revealed from the results shown in Table 5, in a case wherein the Al concentration in the substrate steel was high, the high initial insulation resistance was fairly maintained. This is believed because faults of the Al₂O₃ coatings, including cracking and peeling off of the coatings, which have happened in early stages of the test, are remedied by oxidation of Al existing in the substrate at those positions where the faults have happened. Whereas in a case wherein the Al concentration in the substrate steel was low, the high initial insulation resistance drastically decreased. This is believed because the substrate steel begins to be oxidized at those positions where the coatings crack or peel off in early stages of the test due to the low Al concentration in the substrate, leading to peeling off of the coatings.

EXAMPLE 5

Onto both sides of a rectangular substrate steel foil having a thickness of 0.05 mm and a size of 30 mm×80 mm and made of each of steels having compositions shown in Table 6, Al-O coatings having a thickness of 0.5 μm and an oxygen concentration of 50 mol % were vacuum evaporation coated by the ionization vacuum evaporation method as in Example 4. The coated foil was subjected to a heating and cooling test under ambient atmosphere. The test comprised 6000 cycles of heating from 100° C. to 1000° C. at a rate of 3° C./sec., maintaining at 1000° C. for 10 sec. and allowing to cool from 1000° C. to 100° C. At the end of the 6000 cycles the electric insulation resistance was determined as in Example 4. Results are shown in Table 6. Incidentally, each test piece had an insulation resistance of well above $1 \times 10^{10}$ Ωm.

TABLE 6

Effect of steel components

| Steel components (wt %)* | | | | | | | Insulation |
| --- | --- | --- | --- | --- | --- | --- | --- |
| Al | Cr | REM | Y | C | Si | Mn | resistance** |
| 3.1 | 8.1 | — | — | 0.025 | 0.23 | 0.32 | ◯ |
| 3.1 | 11.6 | — | — | 0.029 | 0.28 | 0.35 | ◯ |
| 3.0 | 17.9 | — | — | 0.021 | 0.20 | 0.28 | ◯ |
| 3.0 | 8.0 | 0.02 | — | 0.022 | 0.33 | 0.35 | ◯ |
| 3.2 | 8.2 | 0.10 | — | 0.031 | 0.35 | 0.36 | ◯ |
| 3.1 | 8.0 | — | 0.11 | 0.028 | 0.31 | 0.30 | ◯ |
| 3.0 | 8.2 | 0.02 | 0.11 | 0.033 | 0.34 | 0.39 | ◯ |
| 3.2 | 0.02 | 0.03 | — | 0.032 | 0.28 | 0.34 | ◯ |
| 3.0 | 0.03 | 0.11 | — | 0.025 | 0.29 | 0.31 | ◯ |
| 3.1 | 0.02 | — | 0.10 | 0.023 | 0.27 | 0.29 | ◯ |
| 3.0 | 0.02 | 0.02 | 0.11 | 0.021 | 0.36 | 0.39 | ◯ |
| 3.1 | 0.004 | — | — | 0.025 | 0.11 | 0.20 | XX |
| 3.1 | 3.0 | — | — | 0.027 | 0.32 | 0.35 | XX |
| 3.3 | 6.4 | — | — | 0.029 | 0.33 | 0.31 | X |

*Balance Fe and impurities
**◯: $1 \times 10^{10}$ Ωm or more
X: not less than $1 \times 10^{1}$ Ωm and less than $1 \times 10^{10}$ Ωm
XX: less than $1 \times 10^{1}$ Ωm As revealed from the results shown in Table 6, in cases wherein Cr was contained in the substrate steel foil, the high initial insulation resistance was fairly maintained. This is believed that even if Al in the substrate steel foil is completely exhausted, the Cr serves to prevent a rapid oxidation of the substrate steel foil at those positions where the coatings crack or peel off in early stages of the test, thereby causing the $Al_2O_3$ coatings to remain adhered to the substrate steel foil.

In cases wherein REM and/or Y was contained in the substrate steel foil, the high initial insulation resistance was fairly maintained. This is believed that the REM and/or Y serves to improve the adhesion of the $Al_2O_3$ coatings to the substrate, thereby preventing peeling off of the $Al_2O_3$ coatings and thus a consumption of Al in the substrate is reduced since only faults due to cracking of the coatings may be self-remedied.

In cases wherein REM and/or Y was not contained in the substrate steel foil and the Cr content in the substrate steel foil is less than 8 mass %, the high initial insulation resistance was not maintained. This is believed because oxidation of the substrate steel foil and peeling off of the $Al_2O_3$ proceed, leading to loss of the insulating property. After the test the Al concentration in the foil was 0.05% by weight. It is considered that with a material such as a foil whose volume is small in comparison with its surface area, during the prolonged cycles of heating and cooling Al in the substrate steel is consumed to complete exhaustion by the self-remedy function at early stages whereby the self-remedy function is lost.

Having so described there is provided according to the invention a iron-based heat-generating material comprising an iron-based alloy capable of generating heat by passing electricity therethrough having a dense heat resistant and insulating coating on the surface of the iron-based alloy. The material according to the invention is particularly useful as a meat-generating member of a heater. The heat resistant and insulating coating is stable for a prolonged period of time at an elevated temperature. Faults in the coating, if happen, can be self-remedied by Al supplied from the iron-based steel alloy. Furthermore, the material according to the invention is economically advantageous in an aspect of its manufacture since the $Al_2O_3$ coating can be rapidly formed.

We claim:

1. A process for production of an oxidation resistant iron-based heat-generating material which comprises vacuum evaporating aluminum onto a surface of an iron-based alloy capable of generating heat by passing electricity therethrough wherein an oxygen partial pressure in a vacuum gaseous atmosphere for the vacuum evaporation is adjusted so that there is formed directly on the surface of the iron-based alloy a coating consisting of aluminum and oxygen, the amount of the oxygen in said coating being less than the stoichiometric amount of oxygen in $Al_2O_3$.

2. The process of claim 1, wherein said iron based alloy comprises, by mass % an amount of C up to 0.2, an amount of Si up to 6, an amount of Mn up to 5, an amount of Al 0.4 to 8, an amount of Cr up to 35, an amount of N up to 0.3, a balance Fe and impurities.

3. The process of claim 2 wherein said iron-based alloy comprises up to 3% Mo, up to 3% Cu, one or more of Ti, Nb, Zr, V up to 1.5% in total, and one or more of rare earth metals (REM) and Y up to 0.2% in total.

4. The process of claim 1 wherein said coating consisting of aluminum and oxygen consists of 50–99 mol % of aluminum and 1–50 mol % of oxygen.

5. The process of claim 1 wherein said iron-based alloy having said coating on said surface thereof is heated to convert a portion of said coating consisting of aluminum and oxygen to an $Al_2O_3$ coating thereby leaving a remaining portion of said coating consisting of aluminum and oxygen.

6. The process of claim 5 wherein said iron-based alloy having said remaining portion of said coating thereon and further having said $Al_2O_3$ coating on said remaining portion of said coating is further heated to convert said remaining portion of said coating to an $Al_2O_3$ coating so that said iron-based alloy is coated with $Al_2O_3$ only.

7. The process of claim 1 wherein said iron-based alloy with said coating thereon is heated to convert said coating to an $Al_2O_3$ coating so that said iron-based alloy is coated with said $Al_2O_3$ coating.

8. The process of claim 1 wherein the aluminum is evaporated using an electron beam.

9. The process of claim 1 wherein the vacuum gaseous atmosphere contains a mixed gas of oxygen and argon.

* * * * *